United States Patent
Nefzi et al.

(10) Patent No.: US 9,632,421 B2
(45) Date of Patent: Apr. 25, 2017

(54) ARRANGEMENT AND LITHOGRAPHY APPARATUS WITH ARRANGEMENT

(71) Applicant: Carl Zeiss SMT GmbH, Oberkochen (DE)

(72) Inventors: Marwene Nefzi, Ulm (DE); Jens Prochnau, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 15/003,970

(22) Filed: Jan. 22, 2016

(65) Prior Publication Data
US 2016/0216611 A1    Jul. 28, 2016

(30) Foreign Application Priority Data
Jan. 26, 2015   (DE) .................. 10 2015 201 255

(51) Int. Cl.
  *G02B 7/02*     (2006.01)
  *G02B 7/182*    (2006.01)
  (Continued)

(52) U.S. Cl.
  CPC ...... *G03F 7/70058* (2013.01); *F16C 32/0417* (2013.01); *F16C 32/0427* (2013.01);
  (Continued)

(58) Field of Classification Search
  CPC ............. F16C 32/0408; F16C 32/0417; F16C 32/0423; F16C 32/0427; F16C 39/063;
  (Continued)

(56) References Cited

U.S. PATENT DOCUMENTS

| 4,340,260 A | 7/1982 | Forster et al. |
| 5,780,943 A | 7/1998 | Ono |

(Continued)

FOREIGN PATENT DOCUMENTS

| DE | 29 38 809 A1 | 4/1981 |
| DE | 10 2009 054 549 A1 | 6/2010 |

(Continued)

OTHER PUBLICATIONS

J. Fremerey "Permanentmagnetische Lager" [permanently magnetic bearings] company publication 0B30-A30 Forschungszentrum Jülich [Jülich research center] 2000.

(Continued)

*Primary Examiner* — Colin Kreutzer
(74) *Attorney, Agent, or Firm* — Fish & Richardson P.C.

(57) ABSTRACT

An arrangement for a lithography apparatus has a component and a weight compensating device to compensate for a weight of the component. The weight compensating device includes a first magnetic device and a second magnetic device. The first magnetic device is designed to exert a first magnetic force on the component. The first magnetic force exceeds the weight of the component. The first magnetic force acts counter to the weight of the component. The second magnetic device is designed to exert a second magnetic force on the component. The second magnetic force acts in the direction of the weight of the component. The first magnetic force corresponds to the sum of the second magnetic force and the weight. The second magnetic device is designed to reduce the second magnetic force at the same time and by the same absolute value as the first magnetic force.

25 Claims, 5 Drawing Sheets

(51) Int. Cl.

| | |
|---|---|
| *G03B 27/54* | (2006.01) |
| *G03B 27/58* | (2006.01) |
| *G03B 27/62* | (2006.01) |
| *G03F 7/20* | (2006.01) |
| *H02N 15/00* | (2006.01) |
| *G02B 7/00* | (2006.01) |
| *F16C 32/04* | (2006.01) |

(52) U.S. Cl.
CPC ............... *G02B 7/00* (2013.01); *G03F 7/20* (2013.01); *G03F 7/70* (2013.01); *G03F 7/70816* (2013.01); *G03F 7/70825* (2013.01); *H02N 15/00* (2013.01)

(58) Field of Classification Search
CPC ..... G02B 7/00; G03F 7/20; G03F 7/70; G03F 7/70716; G03F 7/70758; G03F 7/70816; G03F 7/70825; H02K 7/09; H02N 15/00
USPC ........ 310/90.5; 355/67, 72, 75; 359/819, 871
See application file for complete search history.

(56) References Cited

U.S. PATENT DOCUMENTS

| | | | |
|---|---|---|---|
| 6,831,285 | B2 | 12/2004 | Hol et al. |
| 2004/0135468 | A1 | 7/2004 | De Weerdt et al. |
| 2005/0168086 | A1 | 8/2005 | Tamaki |
| 2006/0209278 | A1 | 9/2006 | Kiuchi et al. |
| 2010/0157270 | A1 | 6/2010 | Muehlbeyer et al. |
| 2011/0267596 | A1* | 11/2011 | Muehlberger ...... G03F 7/70825 355/67 |
| 2013/0314681 | A1 | 11/2013 | Erath et al. |
| 2015/0009557 | A1 | 1/2015 | Muehlberger et al. |

FOREIGN PATENT DOCUMENTS

| | | |
|---|---|---|
| DE | 10 2011 004 607 A1 | 1/2012 |
| DE | 10 2011 088 735 A1 | 6/2012 |
| DE | 10 2013 204 317 A1 | 3/2014 |
| JP | S 55-60719 A | 5/1980 |
| JP | S56-125984 A | 10/1981 |
| JP | S61-258345 A | 11/1986 |
| JP | H2-94418 A | 4/1990 |
| JP | 2004-186687 A | 7/2004 |
| JP | 2004-214555 A | 7/2004 |
| JP | 2004-48919 A | 9/2004 |
| JP | 2005-181760 A | 7/2005 |
| JP | 2005-209670 A | 8/2005 |
| JP | 2006-323295 A | 11/2006 |
| JP | 2009-295801 A | 12/2009 |
| JP | 2010-263230 A | 11/2010 |
| JP | 2012-511821 A | 5/2012 |
| JP | 2012-190041 A | 10/2012 |
| JP | 2014-507786 A | 3/2014 |
| WO | WO 2009/093907 | 7/2009 |

OTHER PUBLICATIONS

German Office Action, with translation thereof, for corresponding DE Appl No. 10 2015 201 255.7, dated Oct. 19, 2015.
Japanese Office Action, with translation thereof, for corresponding JP Appl No. 2016-011414, dated Dec. 21, 2016.

* cited by examiner

ARRANGEMENT AND LITHOGRAPHY APPARATUS WITH ARRANGEMENT

CROSS-REFERENCE TO RELATED APPLICATION

This application claims benefit under 35 U.S.C. §119 of German Patent Applciation Ser. No. 10 2015 201 255.7, filed Jan. 26, 2015, the entire contents of which are incorporated by reference herein.

FIELD

The present disclosure relates to an arrangement for a lithography apparatus with a weight compensating device and to a lithography apparatus with such an arrangement.

BACKGROUND

Microlithography is used for producing microstructured components, such as for example integrated circuits. The microlithographic process is carried out with a lithography apparatus, which has an illumination system and a projection system. The image of a mask (reticle) illuminated via the illumination system is thereby projected via the projection system onto a substrate (for example a silicon wafer) coated with a light-sensitive layer (photoresist) and arranged in the image plane of the projection system, in order to transfer the mask structure to the light-sensitive coating of the substrate.

Driven by the desire for ever smaller structures in the production of integrated circuits, currently under development are EUV lithography apparatuses that use light with a wavelength in the range from 0.1 nm to 30 nm, in particular 13.5 nm. In the case of such EUV lithography apparatuses, because of the high absorption of light of this wavelength by most materials, reflective optics, that is to say mirrors, are used instead of refractive optics, that is to say lenses.

The mirrors may for example be fastened to a supporting frame (force frame) and be designed as at least partially manipulable, in order to allow a movement of a respective mirror in up to six degrees of freedom, and consequently a highly accurate positioning of the mirrors in relation to one another, in particular in the picometer range. This allows changes in the optical properties that occur for instance during the operation of the lithography apparatus, for example as a result of thermal influences, to be compensated.

For mounting the mirrors on the supporting frame, usually weight compensating devices on the basis of permanent magnets (magnetic gravity compensators) are used, as described for example in DE 10 2011 088 735 A1. Such a weight compensating device includes for example a housing which is coupled to the supporting frame and a holding element which is movable with respect to the housing and is coupled to the mirror. Fastened to the holding element are for example two ring magnets (permanent magnets), which together with a ring magnet (permanent magnet) arranged on the housing generate a compensating force in the vertical direction. The compensating force acts counter to the weight of the mirror, and corresponds substantially to it in terms of its absolute value.

By contrast, the movement of a respective mirror—in particular also in the vertical direction—is actively controlled by way of so-called Lorentz actuators. Such a Lorentz actuator respectively includes an energizable coil and, at a distance from it, a permanent magnet. These together generate an adjustable magnetic force for controlling the movement of the respective mirror. One or more Lorentz actuators may be integrated in the weight compensating device, as described for example in DE 10 2011 004 607 A1. In this case, the coil of the Lorentz actuator is arranged in the housing and acts on the two ring magnets arranged on the holding element.

It is problematic however that the compensating force generated by the weight compensating device can change over time. For example, the magnetic forces of the magnets used weaken as a result of aging. The then insufficient (or excessive) weight compensation is balanced out via the Lorentz actuators, which leads to a constant flow of current in the coils of the actuators. The constant flow of current in turn creates a heat source, with potentially adverse consequences for the positioning of the corresponding mirror.

An approach to solving this problem is described in DE 10 2011 088 735 A1. This provides a vertically displaceable ring of magnetically soft material arranged around the weight compensating device. Depending on the position of the ring, it influences the magnetic field of the weight compensating device correspondingly, in order thereby to adjust the compensating force. A disadvantage of this solution is that there is an additional mechanical component, which has to be moved correspondingly.

SUMMARY

The present disclosure seeks to provide an improved arrangement with a weight compensation and also an improved lithography apparatus.

Accordingly, an arrangement for a lithography apparatus having a component and a weight compensating device to compensate for a weight of the component is provided. The weight compensating device includes a first magnetic device, which is designed to exert on the component a first magnetic force, which exceeds the weight of the component and counteracts the weight of the component, and a second magnetic device, which is designed to exert on the component a second magnetic force, which acts in the direction of the weight of the component. The first magnetic force corresponds to the sum of the second magnetic force and the weight, and the second magnetic device is designed to reduce the second magnetic force at the same time and by the same absolute value as the first magnetic force.

The fact that the first magnetic force $F_1$ corresponds to the sum of the second magnetic force $F_2$ and the weight $F_G$, i.e. $F_1=F_2+F_G$, means that the component can be held by the weight compensating device. Accordingly, no additional force, for example from an actuator, is necessary for mounting the component. The fact that the second magnetic force is reduced at the same time and by the same absolute value as the first magnetic force means that the first magnetic force corresponds at all times to the sum of the second magnetic force and the weight. Weight compensation is consequently ensured at all times.

According to one embodiment of the arrangement, the first magnetic device has a first element of a magnetic or magnetizable material and a second element of a magnetic or magnetizable material, the first element and the second element exerting a magnetic force on one another. Both elements may include a magnetic material. Alternatively, at least one of the two elements includes a magnetic material.

In the present case, "magnetic" material means a permanently magnetic, in particular magnetically semihard material (for example AlNiCo magnet) or magnetically hard material (for example rare earth magnet, in particular NdFeB). "Magnetizable" material means here a material that is for example magnetically soft (for example iron), which can be magnetized in particular via a coil.

According to a further embodiment of the arrangement, the first element has a first permanent magnet and/or the second element has a second permanent magnet. A permanent magnet may advantageously exert an attractive or repellent magnetic force on another permanent magnet. Furthermore, a permanent magnet may exert an attractive magnetic force on a magnetizable material.

According to a further embodiment of the arrangement, it also has a first and a second supporting device, the first element or the second element being connected to the component, and the respective other element being connected to the first or second supporting device. The weight compensating device is advantageously connected to a supporting device. Via the supporting device, the arrangement can be connected to the lithography apparatus.

According to a further embodiment of the arrangement, the distance between the first element and the second element of the first magnetic device is adjustable. The adjustment may be performed for example by way of a mechanical adjusting device, for example via a combination of a thread and an associated counter thread. The closer two magnetic materials or a magnetic material and a magnetizable material are brought together, the greater the attractive or repellent magnetic force. The magnetic force that the two elements exert on one another can be advantageously adjusted by way of the distance between the two elements.

According to a further embodiment of the arrangement, the second magnetic device has a third element of a magnetic or magnetizable material and a fourth element of a magnetic or magnetizable material, the third element and the fourth element exerting a magnetic force on one another. Both elements may include a magnetic material. Alternatively, at least one of the two elements includes a magnetic material.

According to a further embodiment of the arrangement, the third element has a third permanent magnet and/or the fourth element has a fourth permanent magnet. A permanent magnet may advantageously exert an attractive or repellent magnetic force on another permanent magnet. Furthermore, a permanent magnet may exert an attractive magnetic force on a magnetizable material.

According to a further embodiment of the arrangement, it also has the first supporting device and the second supporting device, the third element or the fourth element being connected to the component and the respective other element being connected to the first or second supporting device.

According to a further embodiment of the arrangement, the distance between the third element and the fourth element of the second magnetic device is adjustable. The adjustment may be performed for example by way of a mechanical adjusting device, for example via a combination of a thread and an associated counter thread. The closer two magnetic materials or a magnetic material and a magnetizable material are brought together, the greater the attractive or repellent magnetic force. The magnetic force that the two elements exert on one another can be advantageously adjusted by way of the distance between the two elements.

According to a further embodiment of the arrangement, a first percentage loss of the magnetic force per unit of time of at least one permanent magnet of the first magnetic device is different from a second percentage loss of the magnetic force per unit of time of at least one permanent magnet of the second magnetic device, so that the first magnetic force of the first magnetic device and the second magnetic force of the second magnetic device decrease by the same absolute value and at the same time. As a result of the different percentage loss of the first magnetic force and the second magnetic force per unit of time, the first magnetic force and the second magnetic force advantageously decrease by the same absolute value and at the same time. As a result, the weight compensating device can compensate for the weight of the component at all times.

According to a further embodiment of the arrangement, the first percentage loss is less than the second percentage loss and the first magnetic force is greater than the second magnetic force, so that the first magnetic force and second magnetic force decrease by the same absolute value and at the same time. The smaller percentage loss of the first magnetic force can be advantageously compensated by the greater percentage loss of the second magnetic force. In this case, the first magnetic force is greater than the second magnetic force, so that a decrease in the first magnetic force by a smaller percentage in comparison with the second magnetic force leads to a decrease by the same absolute value in the first magnetic force and the second magnetic force. The first magnetic force is greater in terms of its absolute value than the weight of the component. The second magnetic force is correspondingly much less than the first magnetic force. At all times, the sum of the second magnetic force and the weight of the component therefore corresponds to the first magnetic force. The demagnetization curve of at least one permanent magnet of the first magnetic device and the demagnetization curve of at least one permanent magnet of the second magnetic device are made to match one another in such a way that the first magnetic force and the second magnetic force decrease by the same absolute value and at the same time.

According to a further embodiment of the arrangement, at least one permanent magnet of the first magnetic device includes a different material than at least one permanent magnet of the second magnetic device. Different magnetic materials may advantageously have different demagnetization curves.

According to a further embodiment of the arrangement, the first magnetic device is arranged underneath the component, in order to press on the component with the first magnetic force, and the second magnetic device is arranged above the component, in order to press on the component with the second magnetic force. Advantageously, the first magnetic force acts in a direction opposed to the weight of the component and the second magnetic force acts in the direction of the weight of the component. Consequently, the direction of the first magnetic force is opposed to the direction of the second magnetic force. The addition of the force vector of the second magnetic force and the force vector of the weight of the component can thus advantageously balance out the force vector of the first magnetic force, i.e. the resultant force is zero.

According to a further embodiment of the arrangement, the first magnetic device is arranged above the component, in order to pull on the component with the first magnetic force, and the second magnetic device is arranged underneath the component, in order to pull on the component with the second magnetic force. Advantageously, the first magnetic force acts in a direction opposed to the weight of the component and the second magnetic force acts in the direction of the weight of the component. Consequently, the direction of the first magnetic force is opposed to the direction of the second magnetic force. The addition of the force vector of the second magnetic force and the force vector of the weight of the component can thus advantageously balance out the force vector of the first magnetic force, i.e. the resultant force is zero.

According to a further embodiment of the arrangement, multiple first and second magnetic devices are provided. The first magnetic device and the second magnetic device may be divided into multiple individual first and second magnetic devices. The individual magnetic forces of the individual first magnetic devices may then advantageously be much less than the weight of the component.

According to a further embodiment of the arrangement, the second magnetic devices are designed to reduce a sum of the second magnetic forces at the same time and by the same absolute value as a sum of the first magnetic forces. Advantageously, only a sum of the second magnetic forces and the weight of the component are balanced out by a sum of the first magnetic forces.

According to a further embodiment of the arrangement, it also has an actuator for positioning the component, which via a coil exerts a magnetic force on the first, second, third or fourth element, which is connected to the component. The component can be advantageously positioned at the desired location by the actuator. The actuator is preferably a Lorentz actuator.

According to a further embodiment of the arrangement, the component has a holding frame for an optical element and/or has an optical element.

According to a further embodiment of the arrangement, the optical element includes a mirror or a lens.

According to a further embodiment of the arrangement, the first supporting device and/or the second supporting device is/are a supporting frame (force frame). The first supporting device and/or the second supporting device may be advantageously formed as a supporting frame, which is connected to the lithography apparatus. On the other hand, a sensor frame of the lithography apparatus may carry sensors for monitoring the optical elements.

Furthermore, a lithography apparatus, in particular an EUV or DUV lithography apparatus, with an arrangement as described is provided. EUV stands for "extreme ultraviolet" and refers to a wavelength of the working light of between 0.1 and 30 nm. DUV stands for "deep ultraviolet" and refers to a wavelength of the working light of between 30 and 250 nm.

Further possible implementations of the disclosure also include not explicitly mentioned combinations of features or embodiments that are described above or below with respect to the exemplary embodiments. In this respect, a person skilled in the art will also add individual aspects to the respective basic form of the disclosure as improvements or additions.

BRIEF DESCRIPTION OF THE DRAWINGS

Further advantageous configurations and aspects of the disclosure are the subject of the subclaims and also of the exemplary embodiments of the disclosure described below. In the text that follows, the disclosure is explained in more detail on the basis of preferred embodiments with reference to the accompanying figures.

DESCRIPTION OF EXEMPLARY EMBODIMENTS

Figure 1:
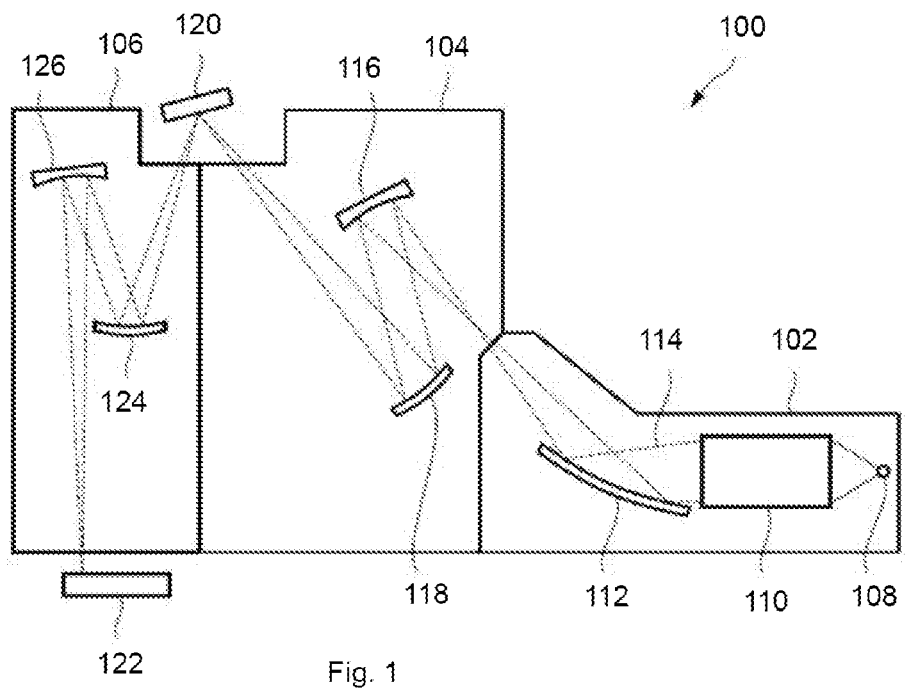
FIG. 1 shows a schematic view of an EUV lithography apparatus.

Unless otherwise indicated, the same reference numerals in the figures designate elements that are the same or functionally the same. It should also be noted that the representations in the figures are not necessarily to scale. It should be explicitly pointed out at this stage that particularly the forces indicated (in newtons) in the text and in the figures are given purely by way of example and are not in any way to be understood as restrictive. The specific figures indicated are intended merely to serve for easier understanding of the specific exemplary embodiment.

FIG. 1 shows a schematic view of an EUV lithography apparatus 100 according to one embodiment, which includes a beam shaping system 102, an illumination system 104 and a projection system 106. The beam shaping system 102, the illumination system 104 and the projection system 106 are respectively provided in a vacuum housing, which is evacuated with the aid of an evacuation device that is not represented any more specifically. The vacuum housings are surrounded by a machine room (not represented any more specifically), in which the drive devices for mechanically moving or adjusting the optical elements are provided. Electrical controllers and the like may also be provided in this machine room.

The beam shaping system 102 has an EUV light source 108, a collimator 110 and a monochromator 112. A plasma source or a synchrotron, which emit radiation in the EUV range (extreme ultraviolet range), that is to say for example in the wavelength range from 0.1 nm to 30 nm, may be provided for example as the EUV light source 108. The radiation emitted by the EUV light source 108 is first focused by the collimator 110, after which the desired operating wavelength is filtered out by the monochromator 112. Consequently, the beam shaping system 102 adapts the wavelength and the spatial distribution of the light emitted by the EUV light source 108. The EUV radiation 114 generated by the EUV light source 108 has a relatively low transmissivity through air, for which reason the beam guiding spaces in the beam shaping system 102, in the illumination system 104 and in the projection system 106 are evacuated.

In the example represented, the illumination system 104 has a first mirror 116 and a second mirror 118. These mirrors 116, 118 may for example be formed as facet mirrors for pupil shaping and conduct the EUV radiation 114 to a photomask 120.

The photomask 120 is likewise formed as a reflective optical element and may be arranged outside the systems 102, 104, 106. The photomask 120 has a structure, a reduced image of which is depicted on a wafer 122 or the like via the projection system 106. For this purpose, the projection system 106 has in the beam guiding space for example a third mirror 124 and a fourth mirror 126. It should be noted that the number of mirrors of the EUV lithography apparatus 100 is not restricted to the number represented, and it is also possible for more mirrors or fewer mirrors to be provided. Furthermore, the mirrors are generally curved on their front side for beam shaping.

An arrangement 200 for an EUV lithography apparatus 100 is described below by way of example for the fourth mirror 126 (hereinafter just mirror 126). The arrangement 200 may however also be used in the case of all the other mirrors of the EUV lithography apparatus 100. Furthermore, the arrangement 200 may also be provided for other components of a lithography apparatus. This applies in particular to lenses, the mounting of the photomask 120 or the mounting of the wafer 122.

Figure 2:
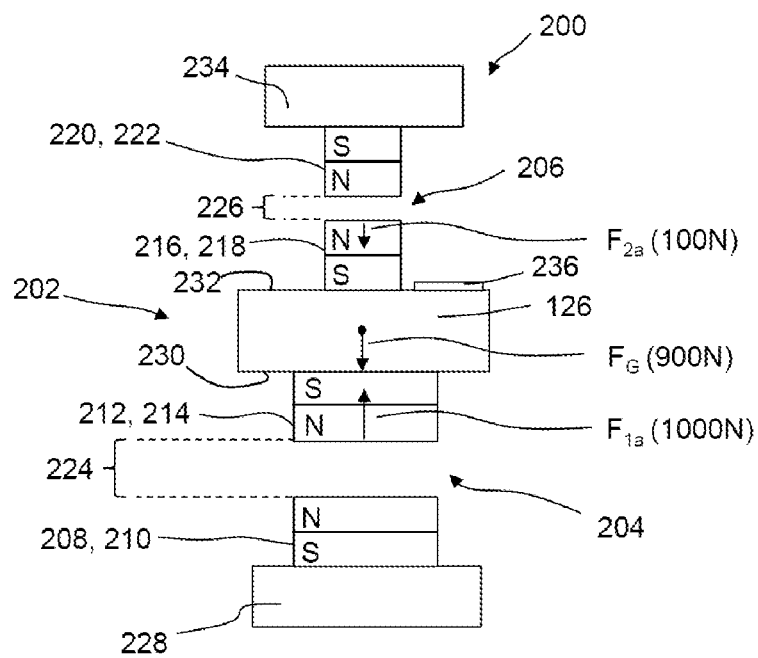
FIG. 2 shows a schematic view of an arrangement according to an exemplary embodiment.

FIG. 2 shows a schematic view of an arrangement 200 according to an exemplary embodiment. The arrangement 200 has a mirror 126 and a weight compensating device 202. The weight compensating device 202 for its part includes a first magnetic device 204 and a second magnetic device 206. The first magnetic device 204 represented shows a first element 208, which has a first permanent magnet 210, and a second element 212, which has a second permanent magnet 214. The second magnetic device 206 represented shows a third element 216, which has a third permanent magnet 218, and a fourth element 220, which has a fourth permanent magnet 222.

The first permanent magnet 210 and the second permanent magnet 214 of the first magnetic device 204 are at a distance 224 from one another, while the third permanent magnet 218 and the fourth permanent magnet 222 of the second magnetic device 206 are at a distance 226 from one another. The first permanent magnet 210 of the first magnetic device 204 is connected to a first supporting device 228, the second permanent magnet 214 of the first magnetic device 204 is connected to the mirror 126 on a first side 230, the third permanent magnet 218 of the second magnetic device 206 is connected to the mirror 126 on a second side 232, and the fourth permanent magnet 222 of the second magnetic device 206 is connected to a second supporting device 234. In this case, the first supporting device 228 and/or the second supporting device 234 may be a supporting frame (force frame) of the lithography apparatus 100. The mirror 126 shown in FIG. 2 has on its second side 232 an optically effective surface 236.

The permanent magnets 210, 214, 218, 222 have a magnetic south pole S and a magnetic north pole N. The magnetic north poles N of the first permanent magnet 210 and of the second permanent magnet 214 point toward one another. Similarly, the magnetic north poles of the third permanent magnet 218 and of the fourth permanent magnet 222 point toward one another. As a result, the first permanent magnet 210 and the second permanent magnet 214 exert a repellent magnetic force on one another, just like the third permanent magnet 218 and the fourth permanent magnet 222. As a consequence, the second permanent magnet 214 of the first magnetic device 204 presses with a first magnetic force $F_1$ onto the first side 230 of the mirror 126 and the third permanent magnet 218 of the second magnetic device 206 presses with a second magnetic force $F_2$ onto the second side 232 of the mirror 126.

The first magnetic force $F_1$ of the first magnetic device 204 exceeds the weight $F_G$ of the mirror 126 and acts counter to the weight $F_G$ of the mirror 126. The second magnetic force $F_2$ of the second magnetic device 206 acts in the direction of the weight $F_G$ of the mirror 126. In this case, the first magnetic force $F_1$ corresponds to the sum of the second magnetic force $F_2$ and the weight $F_G$. In this case, the second magnetic device 206 reduces the second magnetic force $F_2$ at the same time and by the same absolute value as the first magnetic force The fact that the first magnetic force $F_1$ corresponds to the sum of the second magnetic force $F_2$ and the weight $F_G$, means that the mirror 126 can be kept in balance by the weight compensating device 202. No additional force is necessary for the mounting of the mirror 126. The fact that the second magnetic force $F_2$ is reduced at the same time and by the same absolute value as the first magnetic force $F_1$ means that the first magnetic force $F_1$ corresponds at all times to the sum of the second magnetic force $F_2$ and the weight $F_G$. Compensation for the weight $F_G$ is consequently ensured at all times.

FIG. 2 shows the arrangement 200 at a first point in time $t_1$. The first magnetic force $F_{1a}$ at the first point in time $t_1$ is 1000 N, the second magnetic force $F_{1a}$ at the first point in time $t_1$ is 100 N and the weight $F_G$ is 900 N. Because 1000 N−100 N=900 N, the resultant force on the mirror 126 at the first point in time $t_1$ is therefore zero.

Figure 3:
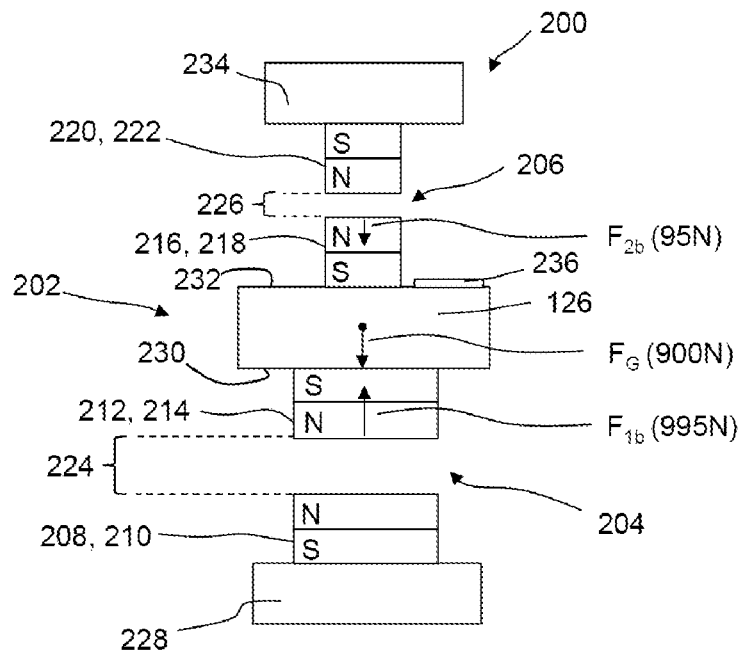
FIG. 3 shows the arrangement from FIG. 2 with aged permanent magnets.
Figure 4:
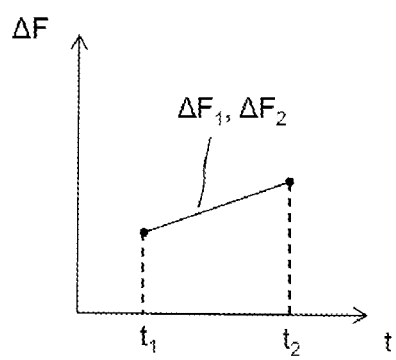
FIG. 4 shows the absolute values for the difference in the first magnetic force and the second magnetic force of the first and second magnetic devices represented in FIGS. 2 and 3, over time.

FIG. 3 shows the arrangement 200 from FIG. 2 with aged permanent magnets 210, 214, 218, 222 at a second point in time $t_2$. The permanent magnets 210, 214, 218, 222 may lose magnetic force over time. The second point in time $t_2$ is for example seven years later than the second point in time $t_1$. The first magnetic force Fib at the second point in time $t_2$ is 995 N, the second magnetic force Feb at the second point in time $t_2$ is 95 N and the weight $F_G$ is 900 N. Because 995 N−95 N=900 N, the resultant force on the mirror 126 at the point in time $t_2$ is therefore also zero. The permanent magnets 218, 222 of the second magnetic device 206 have accordingly lost 5% of magnetic force $F_2$, while the permanent magnets 210, 214 of the first magnetic device 204 have only lost 0.5% of magnetic force FIG. 4 shows the absolute values for the difference $\Delta F_1$ and $\Delta F_2$ in the first magnetic force $F_1$ and the second magnetic force $F_2$ of the first and second magnetic devices 204, 206 represented in FIGS. 2 and 3, over time. The variation from the first point in time $t_1$ to the second point in time $t_2$ is represented. The first magnetic force $F_1$ and the second magnetic force $F_2$ decrease over time. Therefore, the absolute values for the difference $\Delta F_1$ and $\Delta F_2$ over time increase. It can be seen that the absolute value for the difference $\Delta F_1$ in the first magnetic force $F_1$ increases at the same time as the absolute value for the difference $\Delta F_2$ in the second magnetic force $F_2$. As a result, the second magnetic force $F_2$ is reduced at the same time and by the same absolute value as the first magnetic force $F_1$.

The changes $\Delta F_1$, $\Delta F_2$ shown in FIG. 4 are linear. Alternatively, the changes $\Delta F_1$, $\Delta F_2$ may also follow a non-linear progression.

A first percentage loss of the magnetic force $F_1$ per unit of time of at least one permanent magnet 210, 214 of the first magnetic device 204 is different from a second percentage loss of the magnetic force $F_2$ per unit of time of at least one permanent magnet 218, 222 of the second magnetic device 206. In this case, the first percentage loss is less than the second percentage loss. Furthermore, the first magnetic force $F_1$ is greater than the second magnetic force $F_2$. In this way, the first magnetic force $F_1$ and the second magnetic force $F_2$ may decrease with the same absolute value and at the same time.

The first magnetic force $F_1$ is greater than the second magnetic force $F_2$, so that a smaller percentage decrease in the first magnetic force $F_1$ in comparison with the second magnetic force $F_2$ leads to a decrease of the same absolute value in the first magnetic force $F_1$ and the second magnetic force $F_2$. At all times, the sum of the second magnetic force $F_2$ and the weight $F_G$ of the mirror 126 therefore corresponds to the first magnetic force $F_1$. In any event, the demagnetization curve of at least one permanent magnet 210, 214 of the first magnetic device 204 and the demagnetization curve of at least one permanent magnet 218, 222 of the second magnetic device 206 are made to match one another in such a way that the first magnetic force $F_1$ and the second magnetic force $F_2$ decrease by the same absolute value and at the same time. In order to achieve this, at least one permanent magnet 210, 214 of the first magnetic device 204 includes a different material than at least one permanent magnet 218, 222 of the second magnetic device 206.

In one exemplary embodiment, a permanent magnet 210, 214 of the first magnetic device 204 may include samarium cobalt ($Sm_2Co_{17}$). In this case, a permanent magnet 218, 222 of the second magnetic device 206 may include neodymium iron boron ($Nd_2Fe_{14}B$). Alternatively or in addition, a permanent magnet 218, 222 of the second magnetic device 206 may include a ferrite. Ferrites are ferrimagnetic ceramic materials which, in a certain composition, have magnetically hard properties.

The demagnetization curve of at least one permanent magnet 210, 214 of the first magnetic device 204 and the demagnetization curve of at least one permanent magnet 218, 222 of the second magnetic device 206 are made to match one another. At the same time, the demagnetization curves are influenced by a series of factors. Such factors are for example the aging of the materials, the temperature dependence of the materials and the magnetization process of the materials. Furthermore, the form of the magnet may have an influence on the demagnetization curve. In particular, external electromagnetic fields also influence the demagnetization curve of a material. The materials are chosen such that the first magnetic force $F_1$ can at all times correspond as equal to the sum of the second magnetic force $F_2$ and the weight $F_G$.

Figure 5:
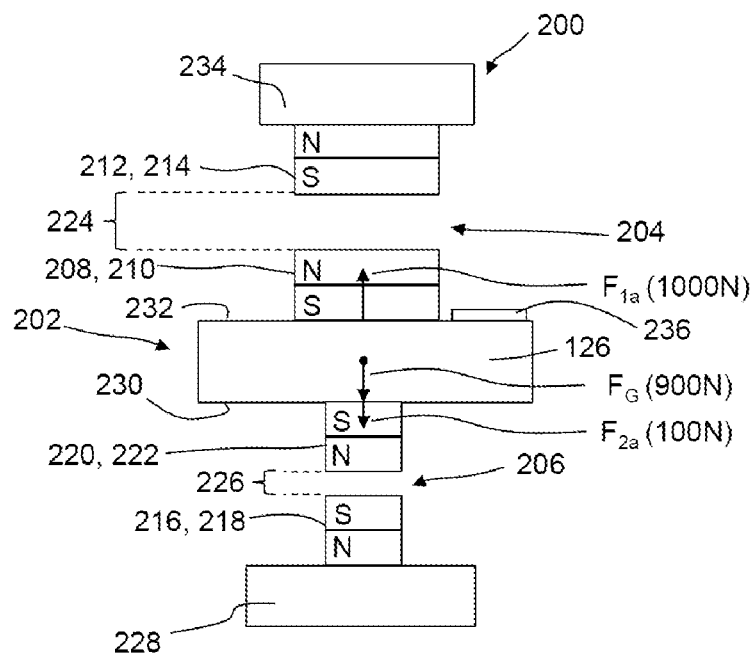
FIG. 5 shows a schematic view of a further exemplary embodiment of an arrangement.

FIG. 5 shows a schematic view of a further exemplary embodiment of an arrangement 200. By contrast with the exemplary embodiment from FIG. 2 and FIG. 3, in the arrangement 200 from FIG. 5 the first magnetic device 204 is arranged above the mirror 126. The second magnetic device 206 is arranged underneath the mirror 126.

Furthermore, the magnetic north pole N of the first permanent magnet 210 is aligned in the direction of the magnetic south pole S of the second permanent magnet 214, so that the first permanent magnet 210 and the second permanent magnet 214 attract one another. Furthermore, the magnetic north pole N of the fourth permanent magnet 222 is aligned in the direction of the magnetic south pole S of the third permanent magnet 218, so that the fourth permanent magnet 222 and the third permanent magnet 218 attract one another. Accordingly, the first magnetic device 204 pulls on the mirror 126 counter to the direction of the weight $F_G$ with a first magnetic force $F_1$. Furthermore, the second magnetic device 206 pulls on the mirror 126 in the direction of the weight $F_G$ with a second magnetic force $F_2$.

FIG. 5 shows the arrangement 200 at a first point in time $t_1$. The first magnetic force $F_{1a}$ at the first point in time $t_1$, which is pulling on the mirror 126, is 1000 N, the second magnetic force F2$a$ at the first point in time $t_1$, which is pulling on the mirror 126, is 100 N and the weight $F_G$ is 900 N. Because 1000 N−100 N=900 N, the resultant force on the mirror 126 at the first point in time $t_1$ is therefore zero.

Figure 6:
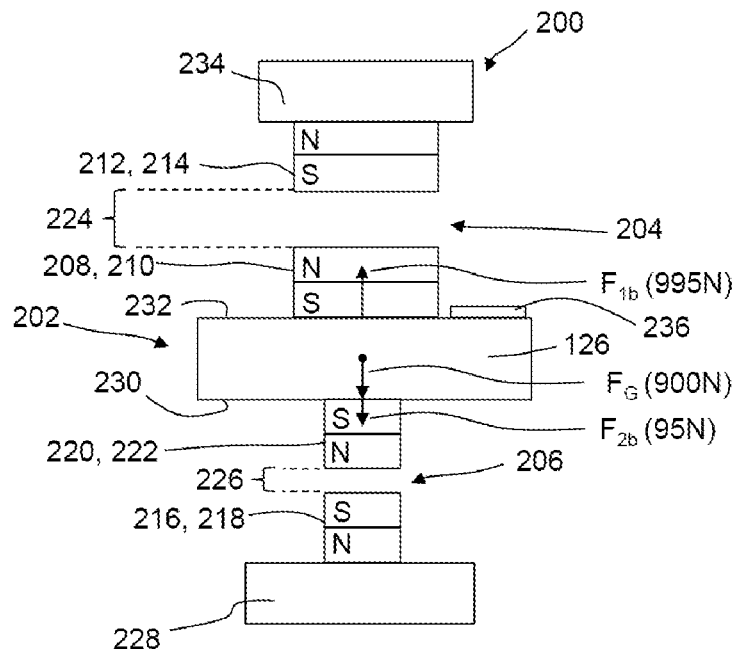
FIG. 6 shows the arrangement from FIG. 5 with aged permanent magnets.

FIG. 6 shows the arrangement 200 from FIG. 5 with aged permanent magnets 210, 214, 218, 222 at a second point in time $t_2$. The second point in time $t_2$ is for example seven years later than the first point in time $t_1$. The permanent magnets 218, 222 of the second magnetic device 206 have in this time lost 5% of magnetic force $F_2$, while the permanent magnets 210, 214 of the first magnetic device 204 have in this time only lost 0.5% of magnetic force $F_1$. The first magnetic force Fib at the second point in time $t_2$, which is pulling on the mirror 126, is therefore 995 N, the second magnetic force Feb at the second point in time $t_2$, which is pulling on the mirror 126, is therefore 95 N and the weight $F_G$ is 900 N. Because 995 N−95 N=900 N, the resultant force on the mirror 126 also at the second point in time $t_2$ is zero. The second magnetic force $F_2$ is consequently reduced at the same time and by the same absolute value as the first magnetic force $F_1$.

Figure 7:
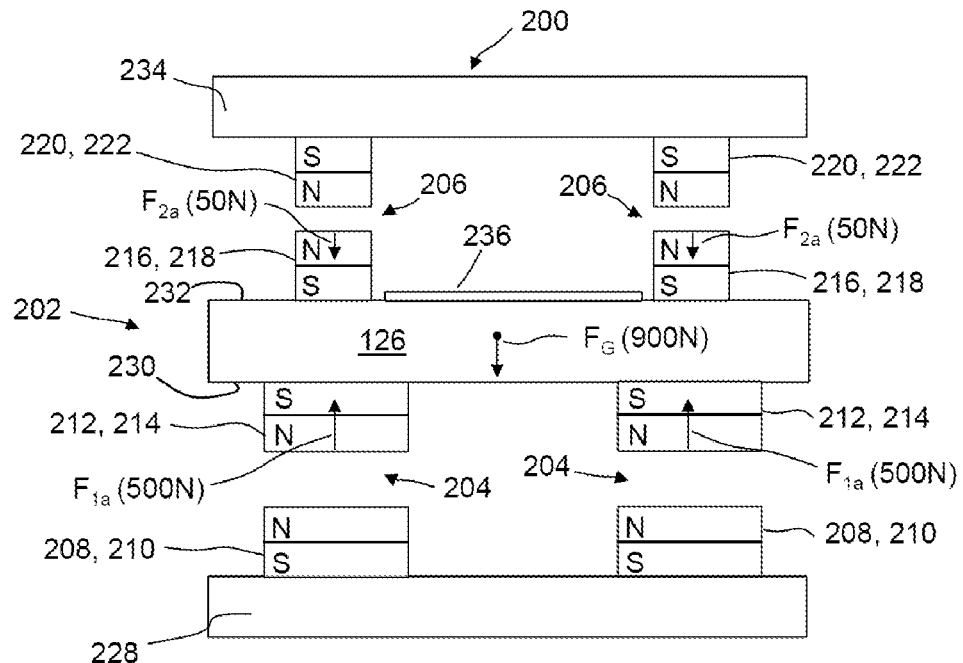
FIG. 7 shows a schematic view of a further exemplary embodiment of an arrangement.

FIG. 7 shows a schematic view of a further exemplary embodiment of an arrangement 200. In principle, the first magnetic device 204 and the second magnetic device 206 may be divided into any number of first and second magnetic devices 204, 206. By contrast with the exemplary embodiment from FIG. 2 and FIG. 3, in the arrangement 200 from FIG. 7 two first magnetic devices 204 and two second magnetic devices 206 are provided. In the arrangement 200 represented in FIG. 7, the optically effective surface 236 of the mirror 126 is provided between the two second magnetic devices 206.

FIG. 7 shows the arrangement 200 at a first point in time $t_1$. The first magnetic forces $F_{1a}$ at the first point in time $t_1$ are respectively 500 N, the second magnetic forces $F_{2a}$ at the first point in time $t_1$ are respectively 50 N and the weight $F_G$ is 900 N. Because 2*500 N−2*50 N=900 N, the resultant force on the mirror 126 at the first point in time $t_1$ is therefore zero.

Figure 8:
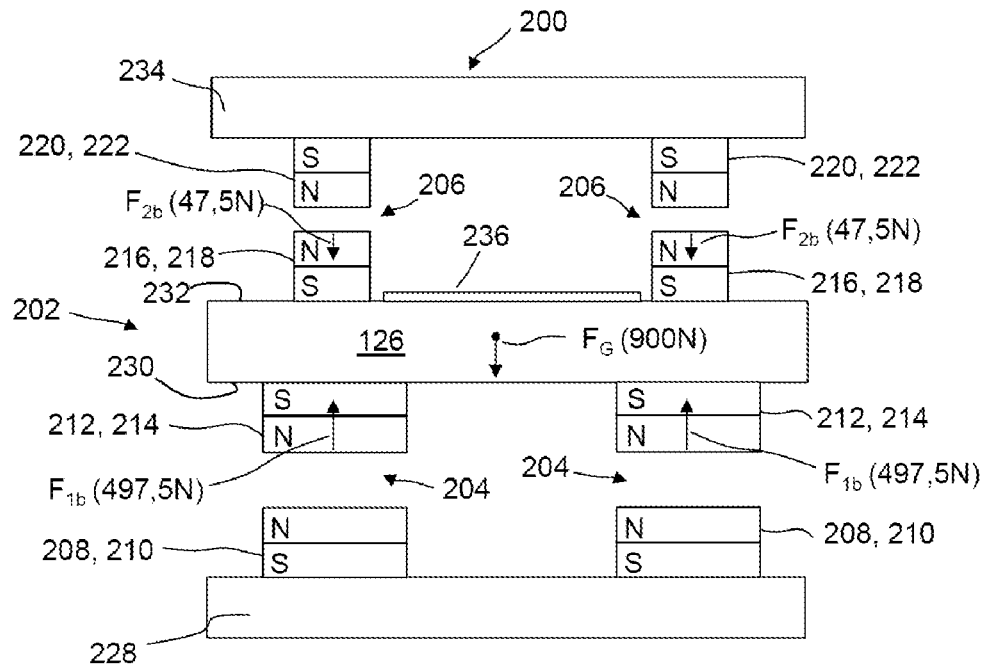
FIG. 8 shows the arrangement from FIG. 7 with aged permanent magnets.

FIG. 8 shows the arrangement 200 from FIG. 7 with aged permanent magnets 210, 214, 218, 222 at a second point in time $t_2$. The second point in time $t_2$ is for example seven years later than the first point in time $t_1$. The permanent magnets 218, 222 of the second magnetic device 206 have in this time lost 5% of magnetic force $F_2$, while the permanent magnets 210, 214 of the first magnetic device 204 have in this time only lost 0.5% of magnetic force $F_1$. The first magnetic forces $F_{1b}$ at the second point in time $t_2$ are therefore respectively 497.5 N, the second magnetic forces $F_{2b}$ at the second point in time $t_2$ are therefore respectively 47.5 N and the weight $F_G$ is 900 N. Because 2*497.5 N−2*47.5 N=900 N, the resultant force on the mirror 126 at the second point in time $t_2$ is also zero. The second magnetic forces $F_2$ are consequently reduced at the same time and by the same absolute value as the first magnetic forces $F_1$.

In the exemplary embodiment represented in FIGS. 7 and 8, the respective first magnetic devices 204 have the same first magnetic forces $F_1$ and the respective second magnetic devices 206 likewise have the same magnetic forces $F_2$. Alternatively, it is sufficient if the second magnetic devices 206 reduce a sum of the second magnetic forces $F_2$ at the same time and by the same absolute value as a sum of the first magnetic forces $F_1$.

Figure 9:
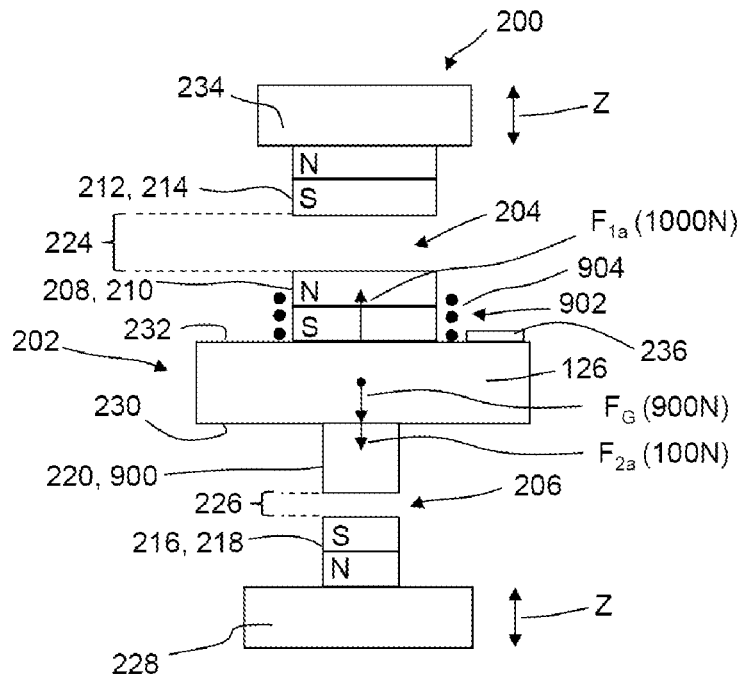
FIG. 9 shows a schematic view of a further exemplary embodiment of an arrangement.

FIG. 9 shows a schematic view of a further exemplary embodiment of an arrangement 200. By contrast with the exemplary embodiment from FIG. 5 and FIG. 6, in the arrangement 200 from FIG. 9 a magnetizable material 900, for example iron, is arranged instead of the fourth permanent magnet 222. The third permanent magnet 218 and the magnetizable material 900 may exert an attractive magnetic force on one another, the material 900 being magnetized via the permanent magnet 218. The second magnetic device 206 can consequently pull on the mirror 126 with a second magnetic force $F_2$.

By analogy with the embodiment according to FIGS. 5 and 6, in the first magnetic device 204 according to FIG. 9 the first permanent magnet 210 and/or the second permanent magnet 214 lose magnetic force. In the case of the second magnetic device 206, only the third permanent magnet 218 loses magnetic force; the fourth element 220 does not have a permanent magnet, and therefore also does not lose force over time. Here, too, the first magnetic force $F_1$ is equal to the sum of the second magnetic force $F_2$ and the weight $F_G$, the first magnetic force $F_1$ and the second magnetic force $F_2$ being reduced at the same time and by the same absolute value.

The arrangement 200 may have an actuator 902. By contrast with the weight compensating device 202, which provides passive weight compensation and positioning of the mirror 126, the actuator 902 serves for actively controlling the position of the mirror 126 in the vertical direction Z.

The actuator 902 may in turn include a coil 904, which is arranged around the first permanent magnet 210. The coil 904 can exert a magnetic force on the second permanent magnet 214. This allows the mirror 126 to be positioned via the actuator 902.

In principle, distances 224, 226 between the permanent magnets 210, 214, 218, 222 and/or the magnetizable material 900 are dictated by the geometry of the arrangement 200, by the mass of the elements involved and by the magnetic forces of the permanent magnets 210, 214, 218, 222. Alternatively, the first supporting device 228 and/or the second supporting device 234 may be moved in the vertical direction Z. In this way, the distance 224 between the first element 208 and the second element 212 of the first magnetic device 204 and the distance 226 between the third element 216 and the fourth element 220 of the second magnetic device 206 can be influenced.

Figure 10:
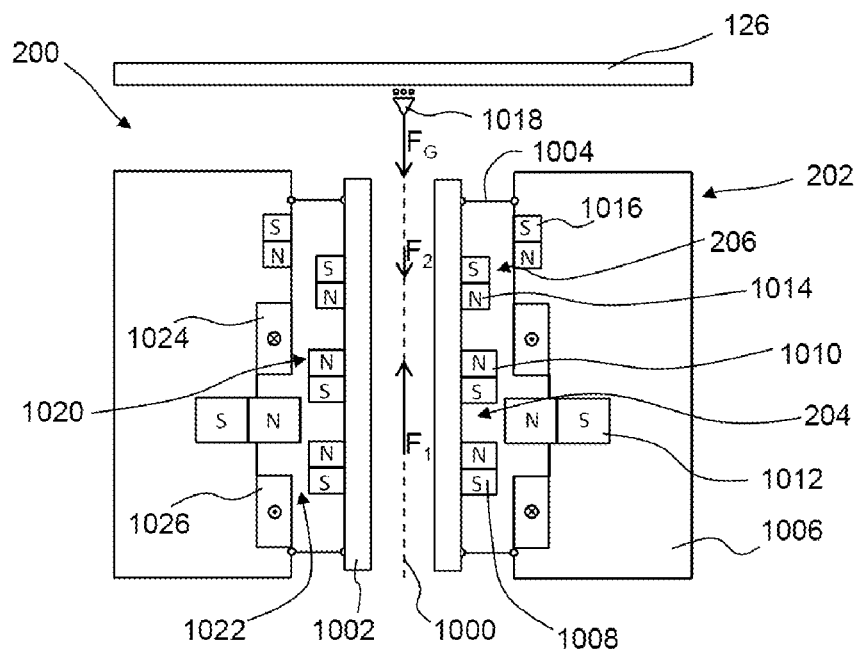
FIG. 10 shows a schematic view of a further exemplary embodiment of an arrangement.

FIG. 10 shows a schematic view of a further exemplary embodiment of an arrangement 200. The arrangement 200 has a component 126 and a weight compensating device 202. The weight compensating device 202 is constructed rotationally symmetrical with respect to an axis 1000. Furthermore, the weight compensating device 202 has a tube 1002, connecting elements 1004 and a housing 1006. The tube 1002 of the weight compensating device 202 extends along the axis 1000. In this case, the tube 1002 is connected to the housing 1006 by way of the connecting elements 1004, so that it is guided in a constrained manner along the axis 1000. The direction of the axis 1000 is likewise the direction in which the weight compensating device 202 exerts the compensating force on the mirror 126 in order to hold it. The weight compensating device 202 shown has a first magnetic device 204 and a second magnetic device 206.

The first magnetic device 204 includes three permanent magnet rings 1008, 1010, 1012. A first outer permanent magnet ring 1012 is connected to the housing 1006. A first inner permanent magnet ring 1008 and a second inner permanent magnet ring 1010 are connected to the tube 1002. The first inner permanent magnet ring 1008 and the second inner permanent magnet ring 1010 are magnetized in the direction of the axis 1000. By contrast with this, the first outer permanent magnet ring 1012 is magnetized radially with respect to the axis 1000.

The second magnetic device 206 includes two permanent magnet rings 1014, 1016. A second outer permanent magnet ring 1016 is connected to the housing 1006. A third inner permanent magnet ring 1014 is connected to the tube 1002.

Furthermore, the first magnetic device 204 is designed to exert on the mirror 126 a first magnetic force $F_1$, which exceeds the weight $F_G$ of the mirror 126 and acts counter to the weight $F_G$ of the mirror 126. The second magnetic device 206 is designed to exert on the mirror 126 a second magnetic force $F_2$ that acts in the direction of the weight $F_G$ of the mirror 126 (i.e. to pull on the mirror 126). In this case, the first magnetic force $F_1$ is equal to the sum of the second magnetic force $F_2$ and the weight $F_G$. Furthermore, the second magnetic device 206 is designed to reduce the second magnetic force $F_2$ at the same time and by the same absolute value as the first magnetic force $F_1$.

The tube 1002 is connected to the mirror 126, in order to exert the compensating force on the mirror 126. This connection by way of a coupling device 1018 assigned to the weight compensating device 202 is only indicated schematically in FIG. 10. The coupling device 1018 mounts the mirror 126 freely movably in a plane perpendicular to the axis 1000. In the direction of the weight $F_G$, i.e. in the direction of the axis 1000, on the other hand, the mirror 126 is held by the weight compensating device 202.

Furthermore, FIG. 10 shows a first actuator 1020 and a second actuator 1022. The actuators 1020, 1022—so-called Lorentz actuators—serve for positioning the mirror 126 by way of the tube 1002.

The first actuator 1020 is formed by a first coil 1024 and the second inner permanent magnet ring 1010. The first coil 1024 of the first actuator 1020 is arranged circumferentially with respect to the axis 1000. The magnetic field of the first coil 1024 of the first actuator 1020 exerts a force on the second inner permanent magnet ring 1010, which is connected to the tube 1002. As a result, the force is transferred to the tube 1002. The first coil 1024 of the first actuator 1020 is connected to the housing 1006.

The second actuator 1022 is formed by a second coil 1026 and the first inner permanent magnet ring 1008. The second coil 1026 of the second actuator 1022 is likewise arranged circumferentially with respect to the axis 1000. The magnetic field of the second coil 1026 of the second actuator 1022 exerts a force on the first inner permanent magnet ring 1008, which is connected to the tube 1002. As a result, the force is transferred to the tube 1002. The second coil 1026 of the second actuator 1022 is connected to the housing 1006. The first coil 1024 of the first actuator 1020 is arranged above the outer permanent magnet ring 1012. By contrast, the second coil 1026 of the second actuator 1022 is arranged underneath the outer permanent magnet ring 1012.

In FIG. 10, the direction of the electrical current is represented for the coils 1024, 1026. The symbols ⊙ (out of the plane toward the viewer) and ⊗ (into the plane away from the viewer) are used.

Various arrangements 200 have been explained on the basis of the mirror 126 of the EUV lithography apparatus 100. However, the configurations represented may of course also be applied to any other mirror of the EUV lithography apparatus 100.

Furthermore, exemplary embodiments of an arrangement 200 in an EUV lithography apparatus 100 have been explained. The lithography apparatus does not have to be an EUV lithography apparatus 100. Light of another wavelength (for example 193 nm via an ArF excimer laser) may also be used. Furthermore, lenses may also be used instead of the mirrors mentioned.

Although the disclosure has been described on the basis of various exemplary embodiments, it is not in any way restricted to them but may be modified in a wide variety of ways.

LIST OF REFERENCE SIGNS

100 EUV lithography apparatus
102 beam shaping system
104 illumination system
106 projection system
108 EUV light source
110 collimator
112 monochromator
114 EUV radiation
116 first mirror
118 second mirror
120 photo mask
122 wafer
124 third mirror
126 fourth mirror
200 arrangement
202 weight compensating device
204 first magnetic device
206 second magnetic device
208 first element
210 first permanent magnet
212 second element
214 second permanent magnet
216 third element
218 third permanent magnet
220 fourth element
222 fourth permanent magnet
224 distance
226 distance
228 first supporting device
230 first side of the mirror
232 second side of the mirror
234 second supporting device
236 optically effective surface
900 magnetizable material
902 actuator
904 coil
1000 axis
1002 tube
1004 connecting element
1006 housing
1008 first inner permanent magnet ring
1010 second inner permanent magnet ring
1012 first outer permanent magnet ring
1014 third inner permanent magnet ring
1016 second outer permanent magnet ring
1018 coupling device
1020 first actuator
1022 second actuator
1024 first coil
1026 second coil
$t_1$ first point in time
$t_2$ second point in time
$F_G$ weight
$F_1$ first magnetic force
$F_{1a}$ first magnetic force at the first point in time
$F_{1b}$ first magnetic force at the second point in time
$F_2$ second magnetic force
$F_{2a}$ second magnetic force at the first point in time
$F_{2b}$ second magnetic force at the second point in time
$\Delta F$ absolute value for the difference in a magnetic force
$\Delta F_1$ absolute value for the difference in the first magnetic force
$\Delta F_2$ absolute value for the difference in the second magnetic force
S magnetic south pole
N magnetic north pole
Z vertical direction

What is claimed is:

1. An arrangement, comprising:
a component having a weight, and a weight compensating device configured to compensate the weight of the component, the weight compensating device comprising first and second magnetic devices,
wherein:
the first magnetic device is configured to exert a first magnetic force on the component;
the first magnetic force acts to counter the weight of the component;
the second magnetic device is configured to exert a second magnetic force on the component;
the second magnetic force acts in a direction of the weight of the component;
the first magnetic force is the sum of the second magnetic force and the weight of the component;
the second magnetic device is configured so that, during use of the arrangement when the first magnetic force changes by an absolute value, the second magnetic force changes: a) at the same time that the first magnetic force changes; and b) by the same absolute value as the change in the first magnetic force; and
the arrangement is a lithography arrangement.

2. The arrangement of claim 1, wherein:
the first magnetic device comprises first and second elements;
the first element comprises a material selected from the group consisting of magnetic materials and magnetisable materials;
the second element comprises a material selected from the group consisting of magnetic materials and magnetisable materials; and the first and second elements are configured to exert a magnetic force on each other.

3. The arrangement of claim 2, wherein at least of the following holds:
the first element comprises a permanent magnet; and
the second element comprises a permanent magnet.

4. The arrangement of claim 2, further comprising first and second supporting devices, wherein:
a first member selected is connected to the component;
a second member is connected to a supporting element selected from the group consisting of the first supporting element and the second supporting element;
the first member is selected from the group consisting of the first element and the second element;
the second member is selected from the group consisting of the first element and the second element; and
the first member is different from the second member.

5. The arrangement of claim 4, wherein at least one of the following holds:
the first supporting device is a holding frame; and
the second supporting device is a supporting frame.

6. The arrangement of claim 2, wherein a distance between the first and second elements is adjustable.

7. The arrangement of claim 2, wherein:
the second magnetic device comprises third and fourth elements;

the third element comprises a material selected from the group consisting of magnetic materials and magnetizable materials;
the fourth element comprises a material selected from the group consisting of magnetic materials and magnetizable materials; and
the third and fourth elements are configured to exert a magnetic force on each other.

8. The arrangement of claim 7, wherein at least one of the following holds:
the third element comprises a permanent magnet; and
the fourth element comprises a permanent magnet.

9. The arrangement of claim 7, further comprising first and second supporting devices, wherein:
a first member selected is connected to the component;
a second member is connected to a supporting element selected from the group consisting of the first supporting element and the second supporting element;
the first member is selected from the group consisting of the third element and the fourth element;
the second member is selected from the group consisting of the third element and the fourth element; and
the first member is different from the second member.

10. The arrangement of claim 7, wherein a distance between the third and fourth elements is adjustable.

11. The arrangement of claim 2, further comprising an actuator configured to position the component by exerting a magnetic force on at least one element selected from the group consisting of the first element, the second element, the third element and the fourth element.

12. The arrangement of claim 1, wherein:
the first magnetic device comprises at least one permanent magnet;
the second magnetic device comprises at least one permanent magnet; and
the arrangement is configured so that, during use of the arrangement, a first percentage loss of a magnetic force per unit of time of the at least one permanent magnet of the first magnetic device is different from a second percentage loss of a magnetic force per unit of time of at least one permanent magnet of the second magnetic device so that the first magnetic force of the first magnetic device and the second magnetic force of the second magnetic device decrease by the same absolute value and at the same time.

13. The arrangement of claim 12, wherein:
the first percentage loss is less than the second percentage loss;
the first magnetic force is greater than the second magnetic force; and
the first magnetic force and second magnetic force decrease by the same absolute value and at the same time.

14. The arrangement of claim 1, wherein:
the first magnetic device comprises a first permanent magnet comprising a first material; and
the first magnetic device comprises a first permanent magnet comprising a second material which is different from the first material.

15. The arrangement of claim 1, wherein the component is between the first and second magnetic devices.

16. The arrangement of claim 1, wherein:
the first magnetic device is beneath the component to press the first magnetic force on the component; and
the second magnetic device is above the component to press the second magnetic force on the component.

17. The arrangement of claim 1, wherein:
the first magnetic device is above the component to pull the first magnetic force on the component; and
the second magnetic device is beneath the component to pull the second magnetic force on the component.

18. The arrangement of claim 1, further comprising a plurality of first magnetic device and a plurality of second magnetic devices.

19. The arrangement of claim 18, wherein the second magnetic devices are configured to reduce a sum of the second magnetic forces at the same time and by the same absolute value as a sum of the first magnetic forces.

20. The arrangement of claim 1, wherein the component comprises a holding frame for an optical element.

21. The arrangement of claim 1, wherein the optical element comprises a mirror or a lens.

22. The arrangement of claim 1, wherein:
the second magnetic device comprises first and second elements;
the first element comprises a material selected from the group consisting of magnetic materials and magnetizable materials;
the second element comprises a material selected from the group consisting of magnetic materials and magnetizable materials; and
the first and second elements are configured to exert a magnetic force on each other.

23. An apparatus, comprising:
an illumination system;
a projection system; and
an arrangement according to claim 1,
wherein the apparatus is a lithography apparatus.

24. The apparatus of claim 23, wherein the illumination system comprises the arrangement.

25. The apparatus of claim 23, wherein the projection system comprises the arrangement.

* * * * *

UNITED STATES PATENT AND TRADEMARK OFFICE
CERTIFICATE OF CORRECTION

PATENT NO. : 9,632,421 B2
APPLICATION NO. : 15/003970
DATED : April 25, 2017
INVENTOR(S) : Marwene Nefzi and Jens Prochnau It is certified that error appears in the above-identified patent and that said Letters Patent is hereby corrected as shown below:

Column 1, Line 8, delete "Applciation" and insert -- Application --.

Column 8, Line 8, after "force", insert -- $F_1$. --.

Column 8, Line 22, delete "$F_{1a}$" and insert -- $F_{2a}$ --.

Column 8, Line 31, delete "Fib" and insert -- $F_{1b}$ --.

Column 8, Line 32, delete "Feb" and insert -- $F_{2b}$ --.

Column 8, Line 39, after "force", insert -- $F_1$. --.

Column 9, make Lines 49-62 a continuation of the paragraph on Line 48.

Column 9, Line 66, delete "F2a" and insert -- $F_{2a}$ --.

Column 10, Line 11, delete "Fib" and insert -- $F_{1b}$ --.

Column 10, Line 13, delete "Feb" and insert -- $F_{2b}$ --.

Signed and Sealed this
Twenty-second Day of August, 2017

Joseph Matal
*Performing the Functions and Duties of the*
*Under Secretary of Commerce for Intellectual Property and*
*Director of the United States Patent and Trademark Office*